United States Patent [19]

Sugiura et al.

[11] Patent Number: 5,028,927
[45] Date of Patent: Jul. 2, 1991

[54] SIGNAL PROCESSING DEVICE FOR ANALOGUE TO DIGITAL CONVERSION

[75] Inventors: Teruki Sugiura, Yamatokooriyama; Yoshiki Nishioka, Tenri; Noriaki Sakamoto, Souraku; Aisaku Taguchi, Tenri, all of Japan

[73] Assignee: Sharp Kabushiki Kaisha, Osaka, Japan

[21] Appl. No.: 399,961

[22] Filed: Aug. 29, 1989

[30] Foreign Application Priority Data

Sep. 2, 1988 [JP] Japan .................. 63-220711

[51] Int. Cl.$^5$ .................................... H03M 1/00
[52] U.S. Cl. ..................... 341/200; 341/123; 341/131; 341/139; 341/156
[58] Field of Search ............... 341/131, 139, 156, 158, 341/161, 123, 162, 200

[56] References Cited

U.S. PATENT DOCUMENTS

| | | | |
|---|---|---|---|
| 3,729,732 | 4/1973 | Yano .................. | 341/162 X |
| 3,855,589 | 12/1974 | Solender .............. | 341/158 X |
| 4,198,677 | 4/1980 | Brunner et al. ........ | 341/120 X |
| 4,336,525 | 6/1982 | Chapple, III .......... | 341/162 |
| 4,875,045 | 10/1989 | Lynch et al. ........... | 341/139 |

FOREIGN PATENT DOCUMENTS 59-86328   5/1984  Japan .
61-186025  8/1986  Japan .
61-186026  8/1986  Japan .

*Primary Examiner*—William M. Shoop, Jr.
*Assistant Examiner*—Randy Gibson
*Attorney, Agent, or Firm*—Merchant, Gould, Smith, Edell, Welter & Schmidt

[57] ABSTRACT

A signal processing device comprises a comparator, a first reference signal generating unit, a second reference signal generating unit and reference signal controller and switch which is switched when the data head data of the input signal is detected by the controller. In the case when the content of the input signal is a clock producing data, the reference signal generated in a rapid process of the first reference signal generating unit is entered in the comparator, and in the case when the content of the input signal is a reproduction data, the reference signal generated in a slow process of the second reference signal generating unit is entered in the comparator so as to be compared with the input signal.

2 Claims, 4 Drawing Sheets

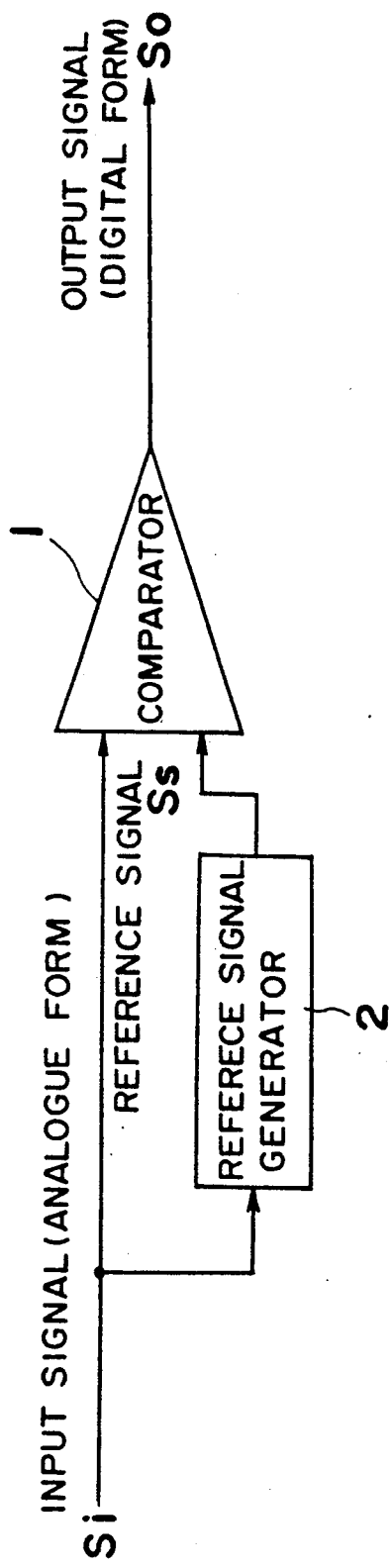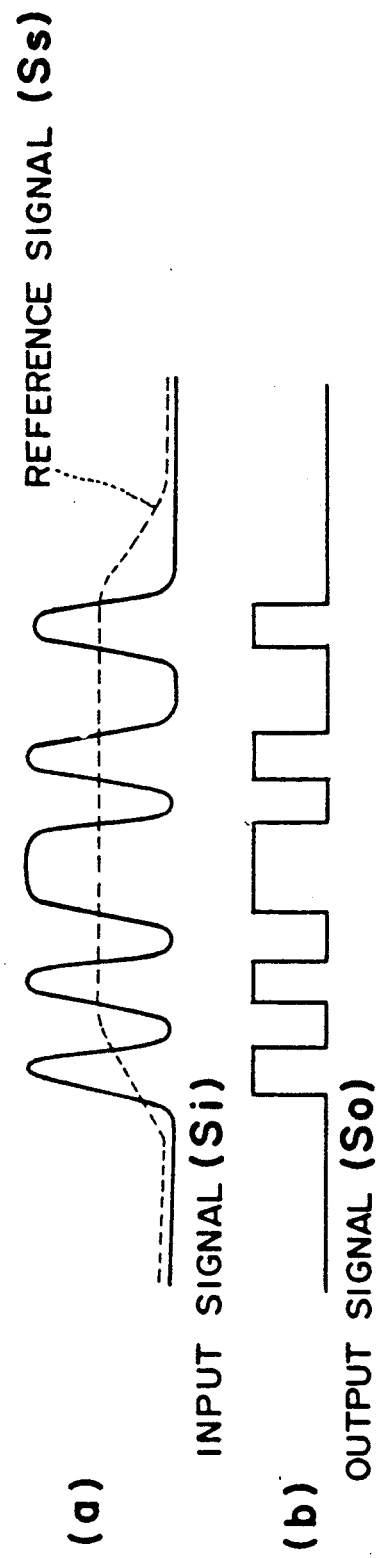

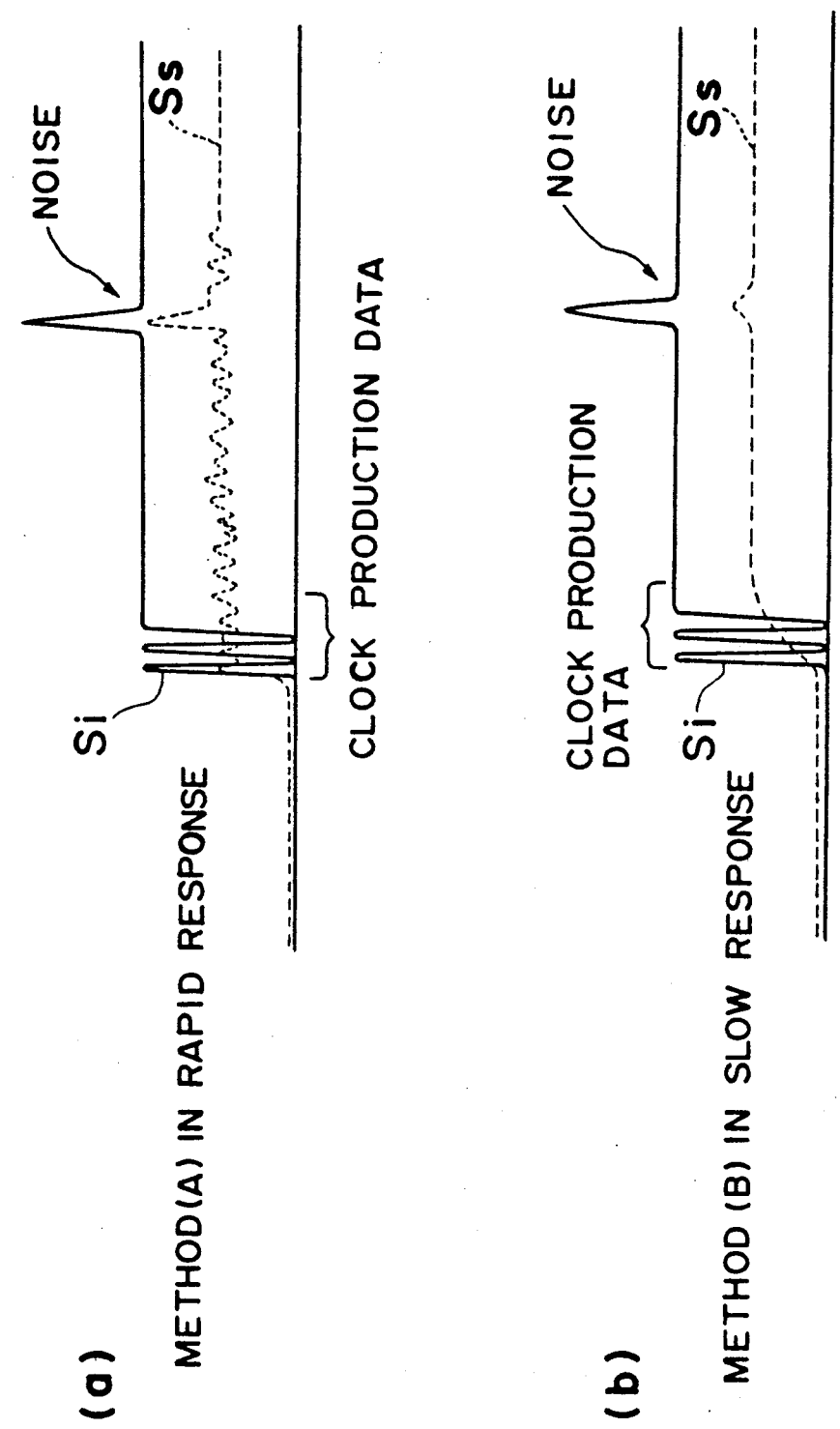

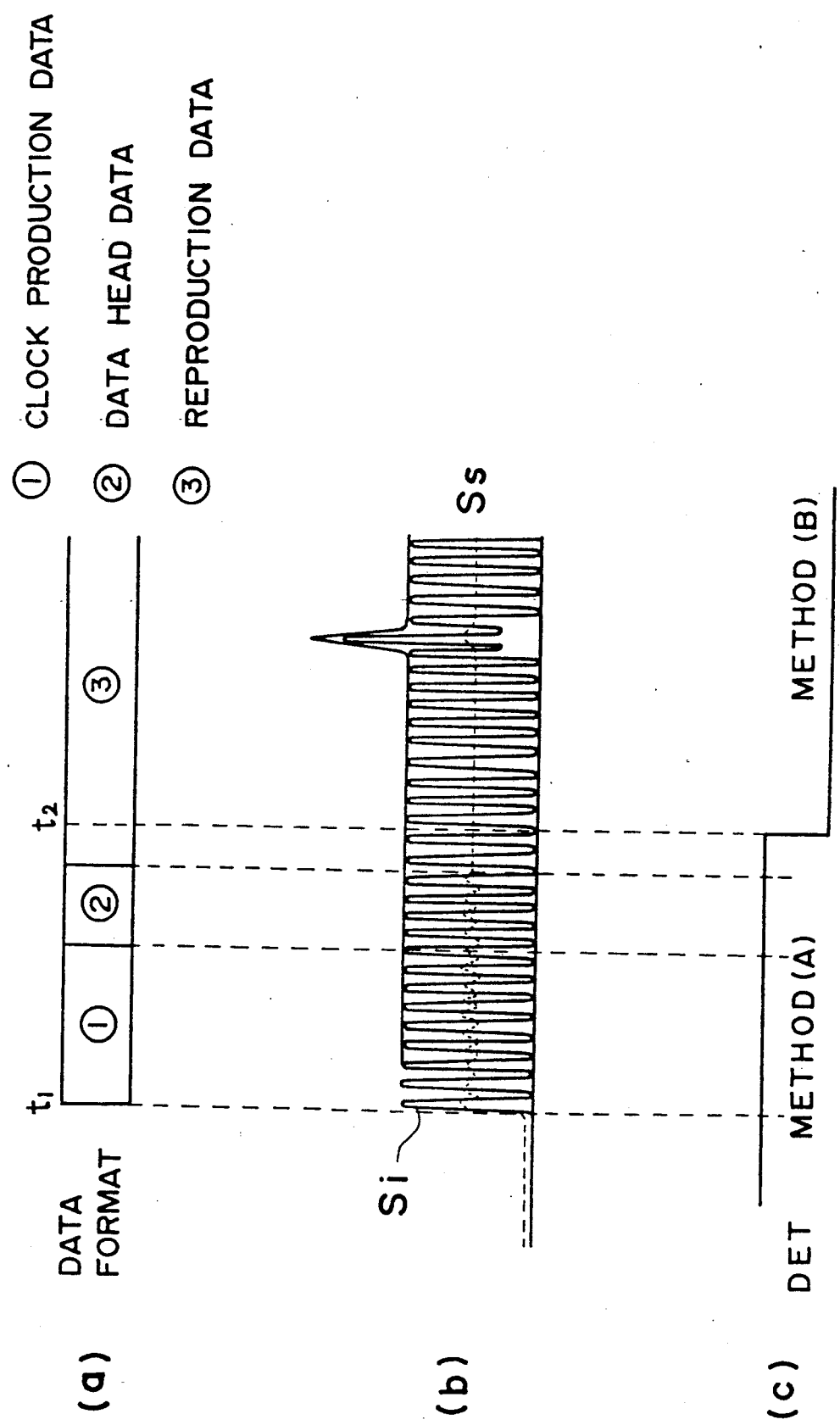

SIGNAL PROCESSING DEVICE FOR ANALOGUE TO DIGITAL CONVERSION

BACKGROUND OF THE INVENTION

1. Field of the Invention

The present invention relates to a signal processing device for use in converting analogue signals read out from an optical magnetic disc or the like into digital signals.

2. Description of the Prior Art

In the prior art, there has been used a signal processing device for converting a signal of an analogue form read out from an optical magnetic disc into a signal of a digital form as shown in FIG. 1. In the conventional signal processing device, a data signal stored in the optical magnetic disc (not shown) is read out in an analogue form by an optical magnetic disc reading device (not shown) and the analogue input signal Si read out from the optical magnetic disc is applied to a comparator 1. At the same time, the analogue input signal Si is applied to a reference signal generator 2. Hereby, the reference signal generator 2 generates a reference signal Ss depending on the analogue input signal Si and the reference signal Ss is entered in the comparator 1. The comparator 1 compares the analogue input signal Si applied from the optical magnetic disc with the reference signal Ss applied from the reference signal generator 2 as shown in FIG. 2(a). The comparator 1 generates a digital output signal So having binary variables, i.e., "1" when the input signal Si is larger than the reference signal Ss and "0" when the input signal Si is smaller than the reference signal Ss as shown in FIG. 2(b).

In order to generate the reference signal Ss by the reference signal generator 2, there are adopted two kinds of signal processing methods for processing the input signal Si of analogue form, a method (A) for processing the analogue input signal Si in a rapid response speed as shown in FIG. 3(a) and a method (B) for processing the analogue input signal Si in a slow response speed as shown in FIG. 3(b).

In FIGS. 3(a) and 3(b), the input signal Si is depicted only by its peak waveform and it is desirable that the reference signal Ss is so formed as to slice the portion lower than the center portion of the envelope waveform of the input signal Si in order to produce correct digital output signals So.

Generally, in the head portion of the input signal Si read out from the optical magnetic disc, there are included clock production data for generating a timing clock pulse at the time of reading out the digital output signal So converted from an analogue form through the signal processing device. When the timing clock pulse is generated by processing the clock production data, the input signal Si must be tracked to be processed in the method (A) in a rapid response speed in order to produce a correct clock signal as shown in FIG. 3(a). On the other hand, when a digital reproduction data signal is produced by processing the analogue data signal read out from the optical magnetic disc, if the response speed is rapid, a noise component is caught so sensitively that the data immediately after the noise can not be read and there easily occur burst errors (continuous errors). Therefore, when the reproduction data signal is processed, the input signal Si must be processed in the method (B) in a slow response speed in order to avoid the influence of the noise as shown in FIG. 3(b).

Therefore, when the reference signal Ss is generated by the reference signal generator 2 in practical use, the clock signal is produced with priority and the reference signal Ss is produced in a slow response speed as slowly as possible in the range that the correct clock can be produced.

As described above, in the conventional signal processing device mentioned above, when the reference signal Ss is generated by the reference signal generator 2 in response to the input signal Si read out from the optical magnetic disc, the response speed is made as slow as possible in the range that the correct clock can be produced by processing the clock production data in the head of the input signal Si. However, in the conventional signal processing device mentioned above, there is a problem that, the influence of the noise, i.e., the burst errors can not be avoided because the response speed is still too rapid in spite of making the response speed as slow as possible in the range of producing the correct clock signal.

SUMMARY OF THE INVENTION

An essential object of the present invention is to provide a signal processing device in which an influence of a noise can be reduced and a correct clock signal can be produced.

In order to accomplish the object mentioned above, the signal processing device of the present invention comprises;

a comparator unit for comparing an input signal including a clock production data, data head data and reproduction data with any one of a first reference signal and a second reference signal to generate an output signal of a binary form depending on the comparison result between said input signal and reference signal, a first reference signal generating unit for receiving the input signal to generate the first reference signal processed in a rapid response speed, a second reference signal generating unit for receiving the input signal to generate the second reference signal processed in a slow response speed, reference signal switching means which is selectively switched depending on said data head data to select the first reference signal from said first reference signal generating unit when the content of said input signal is the clock production data, and to select the second reference signal from said second reference signal generating unit when the content of said input signal is the reproduction data.

The analogue input signal having a clock production data, data head data and reproduction data is entered in the comparator unit and, at the same time, entered in the first and second reference signal generating units. Then, the first reference signal generating unit processes the analogue input signal in a rapid response speed and generates the reference signal. On the other hand, the second reference signal generating unit processes the analogue input signal in a slow response speed so as to generate the reference signal.

When the content of the input signal is the data head data, the reference signal switching means is switched depending on the data head data and when the content of the input signal is the clock producing data, the reference signal generated by the first reference signal generating unit is entered in the comparator unit. On the other hand, when the content of the input signal is the reproduction data, the reference signal generated by the second reference signal generating unit is entered in the comparator unit. Hereby, the comparator unit compares the input signal with the reference signal so that the binary output signal is generated on the basis of the result compared by the comparator.

When the content of the input signal is the clock production data, a correct clock is produced depending on the reference signal generated by the first reference signal generating unit in a rapid response speed.

The reproduction data of the analogue input signal is converted into a digital reproduction signal with stability depending on the reference signal generated in a slow response process of the second reference signal generating unit, avoiding the influence of the noise.

The features of the present invention which are believed to be novel are set forth with particularity in the appended claims. The present invention, both as to its organization and manner of operator, together with further objects and advantages thereof, may best be understood by reference to the following description, taken in conjunction with the accompanying drawings.

BRIEF DESCRIPTION OF THE DRAWINGS

FIG. 1 is a block diagram showing a conventional signal processing device,

FIG. 2(a) is a timing chart showing a comparison between the input signal and the reference signal in the comparator, FIG. 2(b) is a wave form diagram of an output signal of the comparator, FIGS. 3(a) and (b) are explanation views of the operations of the reference signal generators in the methods (A) and (B), FIG. 5 is an explanation view of the input and output signals of the signal processing device according to the present invention.

DETAILED DESCRIPTION OF THE PREFERRED EMBODIMENT

Figure 4:
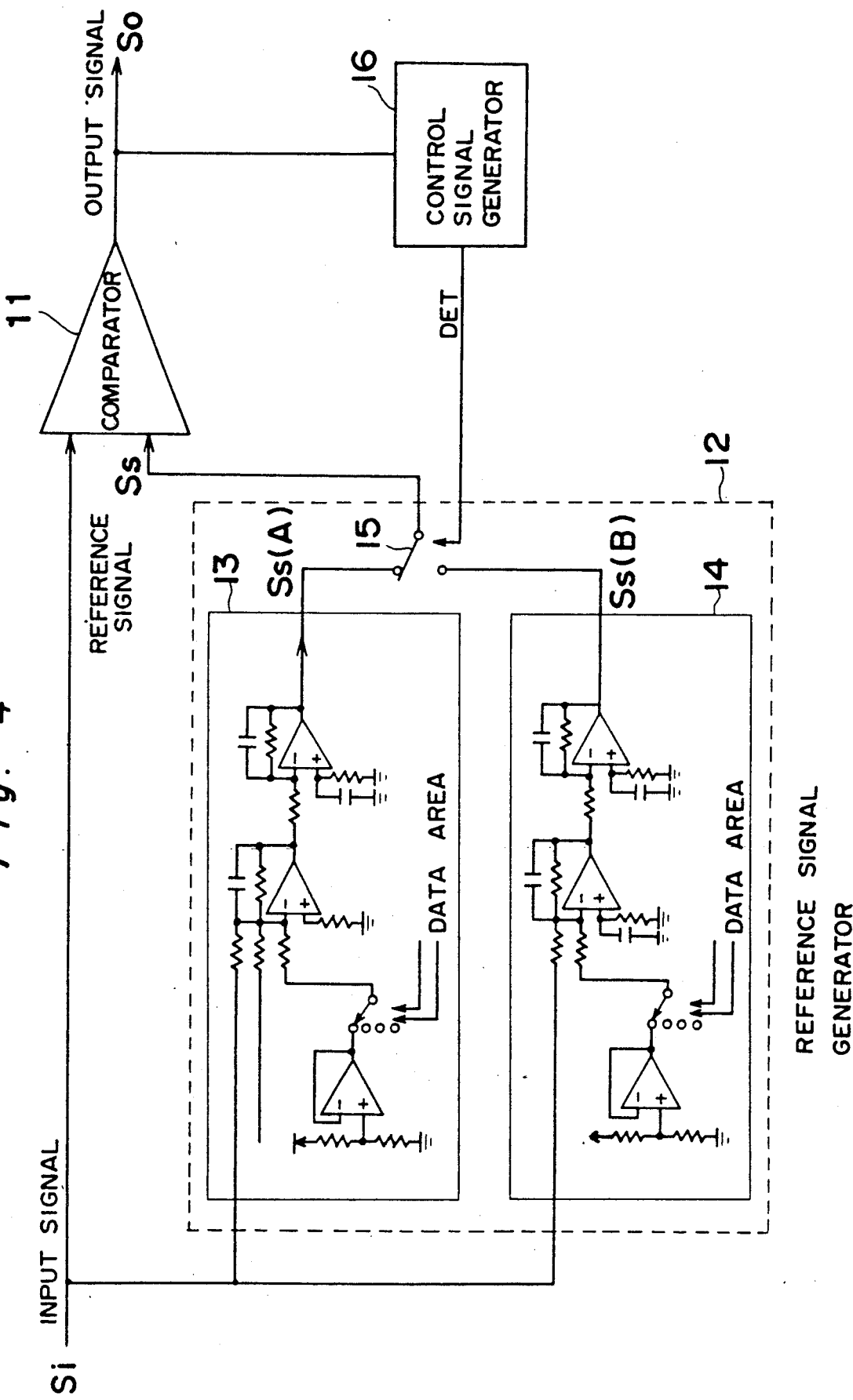
FIG. 4 is a block diagram showing an embodiment of a signal processing device according to the present invention.

An embodiment of the present invention is described hereinafter with reference to the attached drawings.

As shown in FIG. 4, an analogue input signal Si with a frequency of generally at most 1 MHz read out from an optical magnetic disc by an optical magnetic disc reading device (not shown) is applied to a signal processing device and is processed to be converted into a digital output signal So. The analogue input signal Si mentioned above is applied to one of the input terminals of a comparator 11. A reference signal Ss of an analogue form generated by a reference signal generator 12 is applied to another input terminal of the comparator 11. The comparator 11 compares the input signal Si with the reference signal Ss as shown in FIG. 2(a). And as shown in FIG. 2(b), when the amplitude of the input signal Si is larger than that of the reference signal Ss, a digital output signal So having a value of "1" is generated and when the amplitude of the input signal Si is smaller than that of the reference signal Ss, a digital output signal So having a value of "0" is generated from the output terminal of the comparator 11.

The above mentioned reference signal generator 12 is comprised of a first reference signal generating unit 13 for processing the input signal Si in a rapid response speed using a method (A) and a second reference signal generating unit 14 for processing the input signal Si in a slow response speed using a method (B). The first reference signal generating unit 13 using the method (A) of a rapid response speed is composed of a slice detecting circuit arrangement of an envelope type which acts by the magnitude of the envelope of the input signal Si. The input signal Si is processed by the method (A) to produce a reference signal Ss(A) with a frequency of generally 50 to 100 KHz. The second reference signal generating unit 14 using the method (B) of a slow response speed is composed of a slice detecting circuit arrangement of a low-pass type which acts by low frequency components of the input signal Si. The input signal Si is processed by the method (B) to produce a reference signal Ss(B) with a frequency of generally 10 KHz. That is to say, the analogue input signal Si is entered in the reference signal generating units 13 and 14 respectively so that the reference signals Ss(A) and Ss(B) are generated from the first reference signal generating unit 13 and the second reference signal generating unit 14 respectively. A unit data of the input signal Si is written corresponding to each sector of such as an optical magnetic disc and the response of the reference signal Ss is switched depending on whether or not the content of the unit data of the input signal Si is the head portion thereof. The timing of the switching is controlled by another means (not shown).

The switch operation between the first reference signal generating unit 13 and the second reference signal generating unit 14 is performed by means of a reference signal switch 15 which is controlled by a control signal DET. The control signal DET is generated by a control signal generating unit 16 made of such as a timer which starts to count the time at the starting time $t_1$ of the input signal Si based on the output signal So of the comparator 11 and counts up at time $t_2$. That is, when the timer 16 starts at the time $t_1$, the value of the control signal DET is set "1" and at the time $t_2$, the value "1" of the control signal DET is "0". When the value of the control signal DET is "1", the reference signal switch 15 is switched to the first reference signal generating unit 13 and when the value of the control signal DET is "0", the reference signal switch 15 is switched to the second reference signal generating unit 14. By this way, any one of the reference signal Ss(A) generated by the first reference signal generating unit 13 and the reference signal Ss(B) generated by the second reference signal generating unit 14 is selectively applied to the comparator 11 as the reference signal Ss.

FIG. 5(a) shows a data format of the analogue input signal Si to be entered in the reference signal generating units 13 and 14, and FIG. 5(b) shows the wave form of the head portion of the analogue input signal Si and the wave form of the reference signal Ss (shown by broken lines) generated by the reference signal generating unit 13 or 14 depending on the input signal Si, and FIG. 5(c) shows the wave form of the control signal DET.

As shown in the data format in FIG. 5(a), the input signal Si comprises a clock production data (1) for producing timing clock pulses at the time of reading the digital output signal So converted through the signal processing device, data head data (2) for representing the head of the reproduction data, and the reproduction data (3). The input signal Si is entered in the comparator 11 in order of the clock production data (1), data head data (2) and reproduction data (3). Therefore, when the clock production data (1) is to be processed, the value of the control signal DET is made "1" so that the reference signal switch 15 is set in the side of the first reference signal generating unit 13 of the rapid response speed method (A) and the clock production data (1) is processed by the first reference signal generating unit 13 so that the reference signal Ss(A) is generated by the first reference signal generating unit 13 and is entered in the comparator 11.

Next, when the data head data (2) arranged in the head of the reproduction data is detected by a detecting unit (not shown), the value of the control signal DET is made "0" and the reference signal switch 15 is switched to the side of the second reference signal generating unit 14 of the slow response speed method (B). Subsequently, the reproduction data (3) to be entered next is processed by the second reference signal generating unit 14 to generate the reference signal Ss(B), which is entered in the comparator 11.

Accordingly, since the clock production data (1) is converted into a digital reproduction data based on the reference signal Ss(A) generated by the process in a rapid response speed of the first reference signal generating unit 13, there can be generated a correct clock signal. Moreover, since the reproduction data of the analogue input signal Si is processed in a slow response speed by the second reference signal generating unit 14 for generating the reference signal Ss(B), even though there is any noise in the reproduction data, the reference signal Ss(B) can be generated with reduction of a response to the noise, whereby when the input signal Si is converted into the digital output signal So based on the reference signal Ss(B), the digital output signal So can be obtained almost avoiding an influence of the noise, resulting in that the occurrence of the burst errors can be prevented.

As described above, according to the present invention, upon switching the reference signal switch 15 depending on the content of the control signal DET, the reference signal Ss for use in the comparator 11 is generated by a rapid response process of the reference signal generating unit 13 in the case of processing the clock production data, while in the case of processing the reproduction data, the reference signal Ss is generated by a slow response process of the reference signal generating unit 14. Therefore, the clock signal can be correctly generated, moreover the influence of the noise included in the reproduction data of the input signal Si can be reduced.

Although, in the embodiment, the reference signal switch 15 is constituted by a change over switch as shown in FIG. 4, the switch is not limited to the contact switch and it may be arranged by logic elements for example.

Therefore, when the content of the input signal is the clock producing data, the clock signal can be correctly generated based on the reference signal obtained in a rapid response process. Moreover, when the content of the input signal is the reproduction data, the stable digital reproduction signal can be generated based on the reference signal obtained in a slow response process, thereby reducing the influence of the noise.

What is claimed is:

1. A signal processing device comprising;
    a comparator unit for comparing an input signal including a clock production data, data head data and reproduction data with any one of a first reference signal and a second reference signal to generate an output signal of a binary form depending on the comparison result between said input signal and reference signal,
    a first reference signal generating unit for receiving the input signal to generate the first reference signal processed in a rapid response speed,
    a second reference signal generating unit for receiving the input signal to generate the second reference signal processed in a slow response speed,
    reference signal switching means which is selectively switched depending on said data head data to select the first reference signal from said first reference signal generating unit when the content of said input signal is the clock production data, and to select the second reference signal from said second reference signal generating unit when the content of said input signal is the reproduction data.

2. The signal processing device according to claim 1, wherein said input signal of the comparator is a signal of an analogue form generated by an optical magnetic reading device.

* * * * *